(12) United States Patent
Ermer et al.

(10) Patent No.: US 6,380,601 B1
(45) Date of Patent: Apr. 30, 2002

(54) MULTILAYER SEMICONDUCTOR STRUCTURE WITH PHOSPHIDE-PASSIVATED GERMANIUM SUBSTRATE

(75) Inventors: James H. Ermer, Burbank; Li Cai, Northridge; Moran Haddad, Winnetka; Bruce T. Cavicchi, North Hollywood; Nasser H. Karam, Northridge, all of CA (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/280,771

(22) Filed: Mar. 29, 1999

(51) Int. Cl.[7] .................. H01L 31/042; H01L 31/0336; H01L 31/078
(52) U.S. Cl. ............... 257/440; 257/184; 136/249; 136/261; 438/77; 438/94
(58) Field of Search .................. 136/249, 261; 257/184, 440; 438/77, 94

(56) References Cited

U.S. PATENT DOCUMENTS

| | | | | |
|---|---|---|---|---|
| 4,207,670 A | * | 6/1980 | Eline | 29/576 C |
| 5,342,453 A | * | 8/1994 | Olson | 136/262 |
| 5,376,185 A | * | 12/1994 | Wanlass | 136/262 |
| 5,405,453 A | | 4/1995 | Ho et al. | |
| 5,853,497 A | * | 12/1998 | Lillington | 136/249 |
| 5,911,839 A | * | 6/1999 | Tsai | 136/262 |

FOREIGN PATENT DOCUMENTS

EP  0 447 327 A2  3/1991

OTHER PUBLICATIONS

Chiang, P.K., et al. "Large Area GaInP$_2$/GaAS/Ge Multi-junction Solar Cells For Space Applications" (1994) IEEE, pp. 2120–2123.
Weinberg, I.,et al. "Short Communication: Heteroepitaxial InP Solar Cells For Space Applications" (1993) John Wiley & Sons, Ltd., pp. 43–45.
Yamaguchi, M. "Compound Semiconductor Solar Cells, Present Status" (1990) Optoelectronics—Devices and Technologies, vol. 5 No. 2, pp. 143–155.

* cited by examiner

Primary Examiner—Jerome Jackson, Jr.
(74) Attorney, Agent, or Firm—T. Gudmestad

(57) ABSTRACT

A multilayer semiconductor structure includes a germanium substrate having a first surface. The germanium substrate has two regions, a bulk p-type germanium region, and a phosphorus-doped n-type germanium region adjacent to the first surface. A layer of a phosphide material overlies and contacts the first surface of the germanium substrate. A layer of gallium arsenide overlies and contacts the layer of the phosphide material, and electrical contacts may be added to form a solar cell. Additional photovoltaic junctions may be added to form multijunction solar cells. The solar cells may be assembled together to form solar panels.

22 Claims, 3 Drawing Sheets

MULTILAYER SEMICONDUCTOR STRUCTURE WITH PHOSPHIDE-PASSIVATED GERMANIUM SUBSTRATE

This invention was made with government support under Contract No. F33615-95-C-5561 awarded by the US Air Force. The government has certain rights in this invention.

BACKGROUND OF THE INVENTION

This invention relates to multilayer semiconductor structures, and, more particularly, to a solar cell with a phosphide-passivated germanium substrate.

A typical solar cell includes two or more layers of semiconductor materials. The materials are chosen such that, when light from the sun falls upon the solar cell, a voltage difference and current result between the layers. Electrical contacts affixed to the external surfaces of the top-most and bottom-most layers collect the current and provide external electrodes through which the useful electrical energy is conveyed.

Solar cells are used in a variety of terrestrial and space applications. In terrestrial applications, solar cells are often used in remote locations where it is uneconomical to provide power lines. In space applications, solar cells are used to power many types of satellites, such as communications satellites. The performance and operating efficiency of the solar cells is especially important in the space applications, because of the expense of lifting the solar cells and associated structure to orbit.

One well-known type of solar cell uses a homojunction germanium solar cell as the substrate upon which is deposited a gallium arsenide second solar cell. The homojunction within the germanium substrate typically is made by doping the surface region of the germanium substrate with arsenic. The gallium arsenide second solar cell is deposited overlying the doped region, to passivate the germanium and to form the solar cell. The efficiency of such a solar cell may be further improved by adding additional junctions, as by depositing a gallium indium phosphide solar cell overlying the gallium arsenide solar cell. The gallium indium phosphide solar cell converts the shorter wavelengths of solar energy to electrical energy more efficiently. The longer wavelengths pass through the gallium indium phosphide solar cell to the underlying solar cells, where they are converted to electrical energy.

The gallium arsenide/germanium and the gallium indium phosphide/gallium arsenide/germanium multijunction solar cells both are operable and achieve good results, but limitations remain. The inventors have recognized that better electrical characteristics could be obtained through better passivation of the germanium surface and shallower doping of the germanium. The present invention fulfills the need for improved electrical properties of solar cells, and particularly multijunction solar cells.

SUMMARY OF THE INVENTION

The present invention provides a multilayer semiconductor structure. The structure of the invention is useful as an independent solar cell or as the substrate upon which more complex multifunction solar cells are fabricated. The multilayer semiconductor structure is built upon a doped germanium substrate. The approach of the invention allows for better passivation of the germanium homojunction substrate and shallower doping profiles with better control over diffused dopant concentrations. The result is improved electrical characteristics, as compared with existing solar cells.

The approach of the invention also allows for better heteroepitaxial nucleation of the overlying layers of added structure on the germanium substrate.

In accordance with the invention, a multilayer (i.e., two or more layers) semiconductor structure comprises a germanium substrate having a first surface. The germanium substrate comprises two regions, a bulk germanium region, and a phosphorus-doped germanium region adjacent to the first surface. A layer of a phosphide material overlies and contacts the first surface of the germanium substrate. Preferably, the phosphide material is gallium indium phosphide, aluminum indium phosphide, or gallium aluminum indium phosphide. In a preferred embodiment, a layer of n-type gallium arsenide overlies and contacts the layer of the phosphide material. Electrical contacts may be applied to the phosphide layer or, where present, the n-type gallium arsenide layer, and to the opposite face of the germanium substrate.

The bulk germanium region is preferably p-type germanium, and the phosphorus-doped germanium region is preferably n-type germanium. The phosphorus-doped germanium region in conjunction with the bulk germanium region form a homojunction, as required for the solar cell application. The overlying phosphide layer passivates the homojunction, and specifically the phosphorus-doped germanium region.

More complex multilayer structures may be deposited on top of the basic single-junction and multijunction solar cells described above.

The multilayer semiconductor structure of the invention achieves improved electrical conversion performance as a solar cell, as compared with other structures. Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
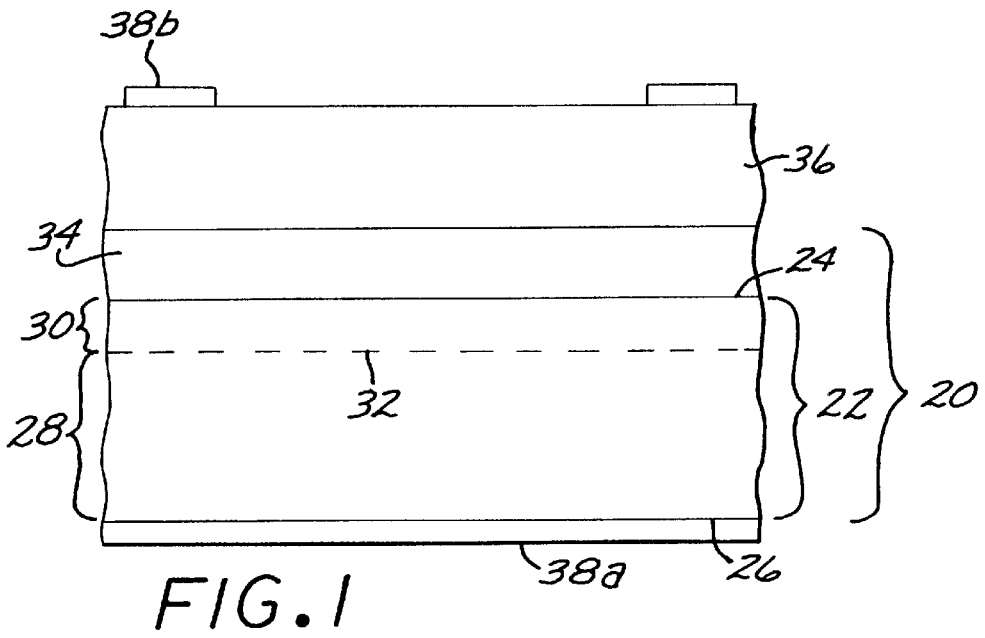
FIG. 1 is a schematic elevational view of a multilayer semiconductor structure according to the invention.

FIG. 1 illustrates a multilayer semiconductor structure 20 according to a preferred embodiment of the invention. (As in the other drawings herein, FIG. 1 is not drawn to scale.) The structure 20 includes a germanium substrate 22 having a first surface 24 and a second surface 26. The germanium substrate 22 is preferably from about 25 micrometers (microns) to about 300 micrometers thick, most preferably from about 150 micrometers to about 200 micrometers thick. The germanium substrate 22 has two regions. A bulk germanium region 28 is p-type germanium. The bulk germanium region 28 typically is doped with gallium in a concentration that is preferably from about $5\times10^{16}$ atoms per cubic centimeter to about $2\times10^{18}$ atoms per cubic centimeter, most preferably about $1\times10^{18}$ atoms per cubic centimeter.

A phosphorus-doped germanium region 30 is an uppermost portion of the germanium substrate 22, adjacent to the first surface 24. The phosphorus-doped germanium region 30 has a boundary 32 with the bulk germanium region 28. The phosphorus-doped germanium region 30 is doped with a sufficient concentration of phosphorus to convert the p-type germanium material to n-type germanium. The phosphorus-doped germanium region 30 is preferably from about 0.1 micrometers to about 3.0 micrometers thick, most preferably from about 0.1 micrometers to about 0.5 micrometers thick. The phosphorus-doped germanium region 30 has a gradient in phosphorus concentration from a maximum value at the first surface 24 to a lesser value at the boundary 32. On average through the region 30, the concentration of the phosphorus in the phosphorus-doped germanium region 30 is from about $1 \times 10^{17}$ to about $1 \times 10^{20}$ atoms per cubic centimeter, more preferably from about $3 \times 10^{18}$ atoms per cubic centimeter to about $3 \times 10^{19}$ atoms per cubic centimeter, and most preferably from about $5 \times 10^{18}$ atoms per cubic centimeter to about $1 \times 10^{19}$ atoms per cubic centimeter. The two regions 28 and 30 provide a homojunction within the germanium substrate 22, in close proximity to the boundary 32.

A layer 34 of a phosphide material overlies and contacts the first surface 24 of the germanium substrate 22. Operable phosphide materials for the layer 34 include, but are not limited to, gallium indium phosphide, aluminum indium phosphide, and gallium aluminum indium phosphide. The thickness of the phosphide layer 34 is preferably from about 25 Angstroms to about 5000 Angstroms, more preferably from about 25 Angstroms to about 1500 Angstroms, even more preferably from about 25 Angstroms to about 500 Angstroms, and most preferably about 100 Angstroms.

The composition of the phosphide layer 34 may be selected to provide a desired degree of lattice matching with the underlying n-doped germanium region 30, which is typically close to [001] germanium. To cite examples, gallium indium phosphide is nominally $Ga_{0.5}In_{0.5}P$ and aluminum indium phosphide is nominally $Al_{0.5}In_{0.5}P$. The Ga/In and Al/In ratios may be altered slightly to achieve lattice matching, such as to $[Ga_{0.49}In_{0.51}]P$ and $[Al_{0.49}In_{0.51}]P$, respectively. Gallium aluminum indium phosphide is nominally $[GaAl]_{0.5}In_{0.5}P$, but its elemental ratios may be changed slightly, as for example to $[GaAl]_{0.49}In_{0.51}P$. Such changes in the elemental ratios alter the lattice parameters of the phosphide material. By selection of the elemental ratios, the lattice parameter of the phosphide layer 34 may be matched, or selectively made non-matching, to the underlying n-doped germanium region 30. The nucleation and growth of layer 34, as well as the overlying layers, on the region 30 is controlled to some extent by the degree of lattice matching. Absent the phosphide layer and its several degrees of freedom in adjusting the elemental ratios and therefore the lattice constant, there is substantially less control over the nucleation and growth of any overlying layers, such as will be described subsequently.

The n-doped germanium region 30 and the phosphide layer 34, while both containing phosphorus, are distinctly different portions of the structure 20. The concentration of phosphorus dopant in the n-doped germanium region 30 is relatively dilute so that the phosphorus is considered a dopant, whereas the concentration of phosphorus in the phosphide layer 34 is relatively high so that the phosphorus is considered a constituent element.

To form a solar cell, a contacting layer 36 of n-type gallium arsenide may be deposited overlying the structure 20. The contacting layer 36 is gallium arsenide doped with a concentration of silicon at $2 \times 10^{18}$ atoms per cubic centimeter, and is preferably about 0.5 micrometers thick. Electrical contacts 38 in the form of a metallization layer 38a contacting the second surface 26 and an array of stripes 38b contacting the exposed face of the contacting layer 36 are added.

The structure 20 may be used either in stand-alone applications, with the contacting layer 36, or in conjunction with other overlying layers to form a wide variety of devices. (In stand-alone applications, the contacting layer may be provided as a layer lying only under the electrical contacts 38b, rather than as a full layer as illustrated in FIG. 1.) The preferred application is a multijunction solar cell, which is built upon the structure 20. The following discussion describes a preferred multijunction solar cell, but the structure 20 may be used in other applications as well.

Figure 2:
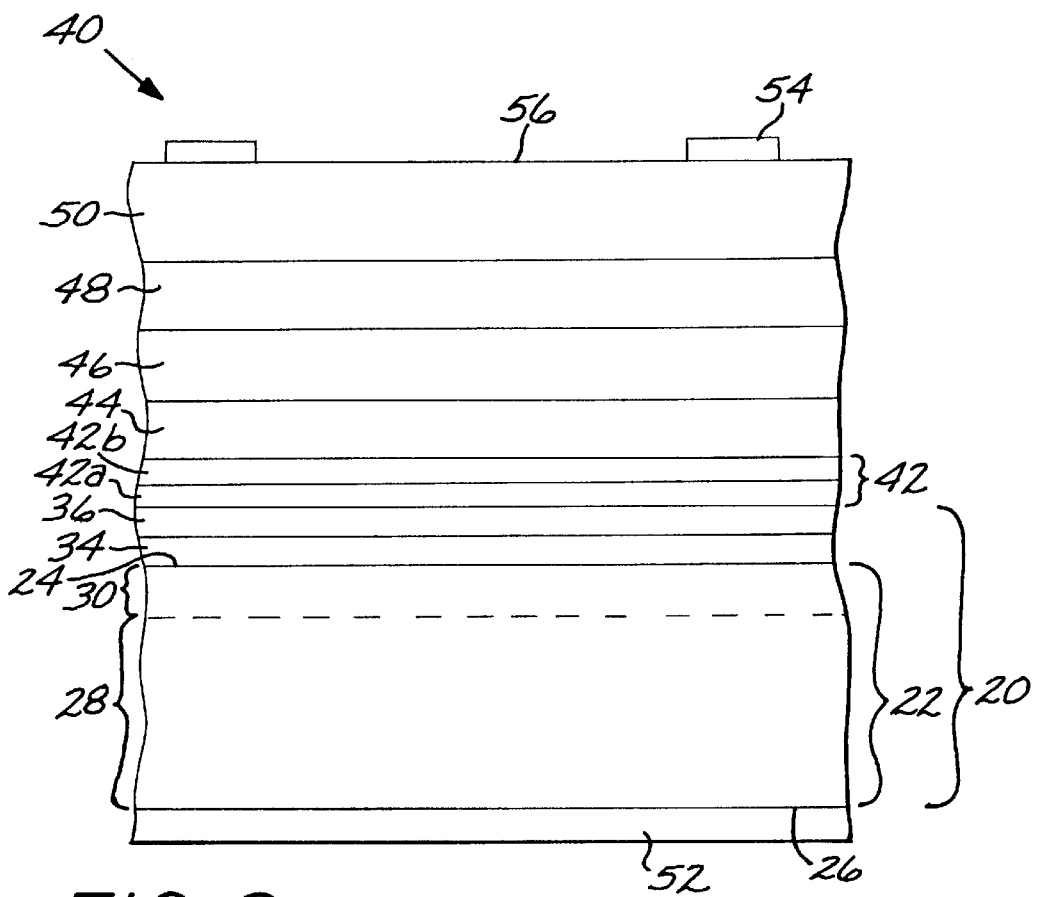
FIG. 2 is a schematic elevational view of a multifunction solar cell according to the invention.

FIG. 2 depicts a multijunction solar cell 40 comprising the structure 20, as well as additional layers. The above discussion of the structure 20 is incorporated here, and the same reference numerals are used in FIG. 2 where applicable.

In the solar cell 40, a tunnel junction 42 overlies an upper surface of the contacting layer 36. The tunnel junction 42 is formed of two sublayers, an n-type gallium arsenide layer 42a doped with about $1 \times 10^{19}$ to about $1 \times 10^{20}$ atoms per cubic centimeter of tellurium that overlies and contacts the contacting layer 36, and a p-type gallium arsenide layer 42b doped with from about $1 \times 10^{19}$ to about $5 \times 10^{20}$ atoms per cubic centimeter of carbon that overlies and contacts the layer 42a. Each of the layers 42a and 42b is from about 100 to about 900 Angstroms thick. The tunnel junction is essentially transparent to light to permit illumination of the underlying structure 20.

Overlying and contacting the tunnel junction 42 is a back surface field layer 44 of p-type gallium indium phosphide, which is preferably about 1000 Angstroms thick. Overlying and contacting the back surface field layer 44 is a layer 46 of p-type gallium arsenide, which is preferably from about 1 to about 5 micrometers thick. Overlying and contacting the layer 46 is a layer 48 of n-type gallium arsenide, which is preferably from about 500 to about 5000 Angstroms thick. Overlying and contacting the layer 46 is a window layer 50 of n-type gallium indium phosphide, which is preferably from about 250 to about 5000 Angstroms thick. The window layer 50 passivates the structure and is resistant to physical damage arising from external sources.

Electrical contact to the multijunction solar cell 40 is made through a back surface metallization layer 52 deposited on the second (back) surface 26, and through a series of top surface stripes 54 contacting a top surface 56 of the window layer 50 or a suitable intermediate contacting material overlying the window layer. Solar energy is introduced into the solar cell 40 through the portion of the top surface 56 which is not covered with the electrical contact stripes 54.

Other layers and elements may also be provided on the solar cell 40, and the present invention is compatible with the use of such additional layers and elements.

Figure 3:
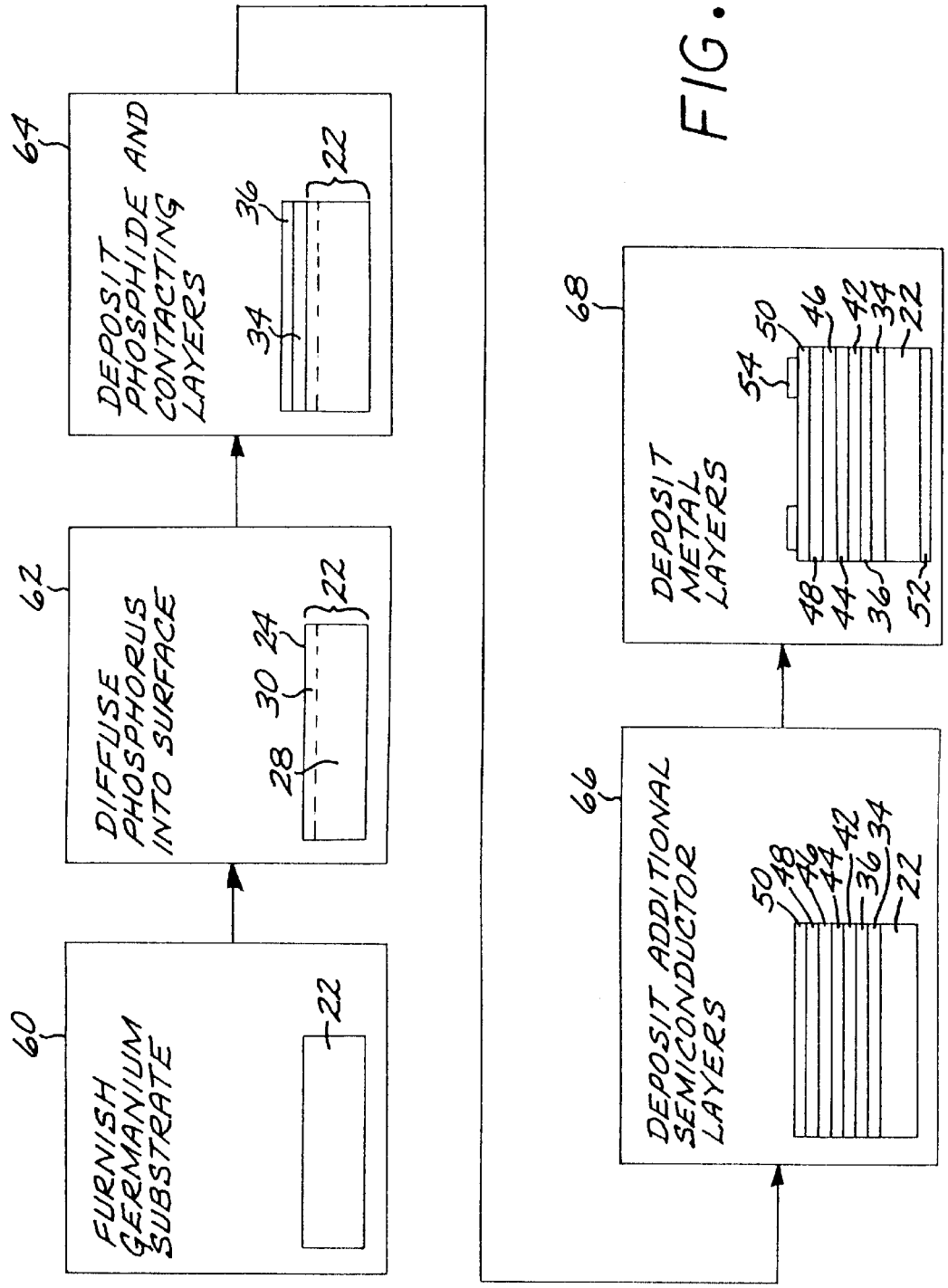
FIG. 3 is a pictorial block flow diagram of an approach for fabricating the solar cell of FIG. 2.

FIG. 3 illustrates a preferred approach to the fabrication of a multilayer semiconductor structure 20 and a multifunction solar cell 40, as depicted in FIGS. 1 and 2, respectively. The germanium substrate 22 is furnished, numeral 60. The p-doped germanium substrate material is available commercially.

Phosphorus atoms are deposited on the first surface 24 and diffused into the first surface 24 to create the phosphorus-doped germanium region 30, numeral 62. The deposition is preferably accomplished by metal-organic vapor phase epitaxy (MOVPE). A commercially available MOVPE apparatus, used by the inventors to make prototype specimens, is an EMCORE E-400 production reactor. In the preferred approach, the germanium substrate 22 is heated to a temperature of about 580° C.–750° C., and phosphine gas introduced to contact the first surface 24. Phosphorus atoms deposited onto the first surface 24 diffuse into the germanium substrate 22, to create the region 30. The introduction and interdiffusion of phosphorus atoms continues during the subsequent deposition of the phosphide layer 34, so that the total time of diffusion of phosphorus into the substrate 22 is about 1 hour but may be adjusted as desired to establish the depth of the n-doped region 30. The use of phosphorus and phosphides allows more shallow doping than in the prior approach of using arsenic and arsenides. This shallow doping is more desirable for the emitter region of the germanium homojunction structure.

The phosphide layer 34 is deposited onto the first surface 24, numeral 64. The phosphide layer is preferably deposited by MOVPE. After the step 62 has continued for a sufficient period of time to diffuse the desired phosphorus atoms, metal organic vapors containing the other elements of the phosphide layer 34 are introduced into the MOVPE apparatus, together with the phosphine gas, to commence step 64. Gases used as sources of the remaining elements of the phosphide layer 34 include, for example, trimethyl gallium or triethyl gallium as a source of gallium, trimethyl or triethyl aluminum as a source of aluminum, and trimethyl indium as a source of indium. Other organic and inorganic gases may be introduced as sources for other elements, such as dopants of the layer 14, if desired. The deposition step 64 is continued for as long as required to produce the desired thickness of the phosphide layer 34. The layer 36 of gallium arsenide is deposited onto the layer 34 from a mixture of trimethyl or triethyl gallium and arsine gases.

At this point, fabrication of the multilayer semiconductor structure 20 is complete.

To fabricate the multijunction solar cell 40, the additional semiconductor layers 42a, 42b, 44, 46, 48, and 50 are deposited in that order, numeral 66, preferably by MOVPE. After the deposition step 66 is completed, the structure is cooled to room temperature and removed from the MOVPE apparatus. The electrical contact metallization layer 52 and the stripes 54 are deposited, numeral 68, typically by electron beam vapor deposition, though a mask in the case of the stripes 54.

If more than one solar cell is fabricated at a time on a large substrate, as would usually be the case in a production operation, the wafer may thereafter be diced to separate the individual solar cells.

Structures 20 were fabricated according to the methods described herein, for gallium indium phosphide layer 34 (24 cells) and aluminum indium phosphide layer 34 (23 cells), and the contacting layer 36. For comparison, a conventional cell was fabricated with no phosphide layer 34 (11 cells), and having only the contacting layer 36 overlying an arsenic-doped germanium substrate. All of the cells were tested under equivalent test conditions. The gallium indium phosphide cells achieved, on average, an open circuit voltage of 0.213 volts, a short-circuit current of 0.117 amperes, and an efficiency of 2.31 percent. The aluminum indium phosphide cells achieved, on average, an open circuit voltage of 0.195 volts, a short-circuit current of 0.112 amperes, and an efficiency of 2.13 percent. The conventional cells achieved, on average, an open circuit voltage of 0.204 volts, a short-circuit current of 0.110 amperes, and an efficiency of 1.95 percent.

Figure 4:
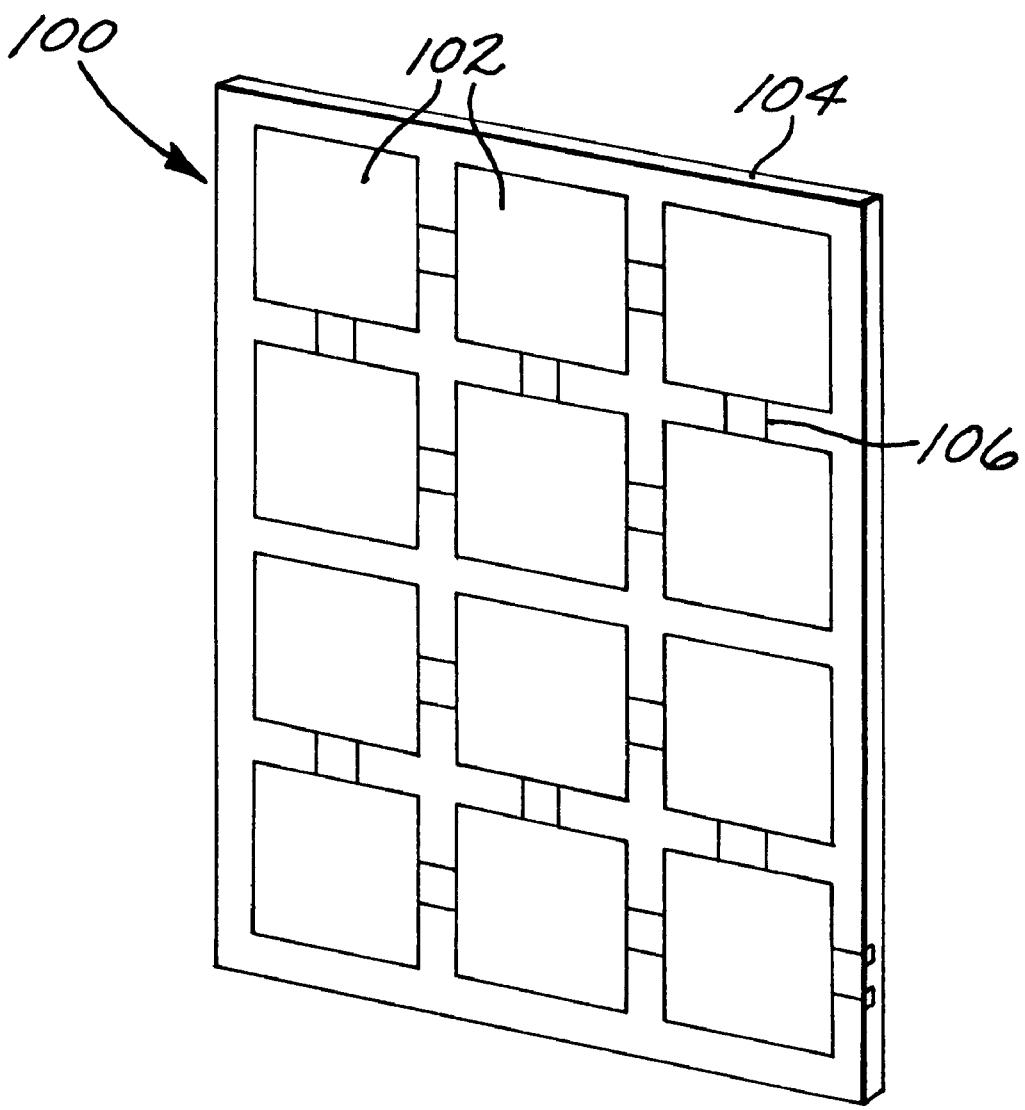
FIG. 4 is a schematic perspective view of a solar panel utilizing a solar cell according to the invention.

As shown in FIG. 4, two or more of the individual solar cells made according to the approach of the invention may be assembled together and electrically interconnected to form a solar panel 100. The solar panel 100 includes a sufficient number of individual solar cells 102, such as the solar cells 40 of FIG. 2 or other solar cells employing the approach of the invention, appropriately interconnected to provide the desired voltage and current outputs. The individual solar cells 102 are mounted to a support base 104 and electrically interconnected by appropriate wiring 106 to a controller (not shown).

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A multilayer semiconductor structure, comprising:
   a germanium substrate having a first surface, the germanium substrate comprising two regions,
      a bulk germanium region, and
      a phosphorus-doped germanium region adjacent to the first surface; and
   a layer of a phosphide material overlying and contacting the first surface of the germanium substrate.

2. The structure of claim 1, further including
   a layer of gallium arsenide overlying and contacting the layer of the phosphide material.

3. The structure of claim 1, wherein the layer of the phosphide material comprises a material selected from the group consisting of gallium indium phosphide, aluminum indium phosphide, and gallium aluminum indium phosphide.

4. The structure of claim 1, wherein the bulk germanium region is p-type germanium.

5. The structure of claim 1, wherein the phosphorus-doped germanium region is n-type germanium.

6. The structure of claim 1, wherein the phosphorus-doped germanium region extends inwardly from the first surface toward the germanium region for a distance of from about 0.1 to about 3.0 micrometers.

7. The structure of claim 1, wherein the phosphorus-doped region has an average phosphorus content of from about $1 \times 10^{17}$ to about $1 \times 10^{20}$ atoms per cubic centimeter.

8. The structure of claim 1, wherein the layer of the phosphide material has a thickness of from about 25 to about 5000 Angstroms.

9. The structure of claim 2, further including
   a first electrical contact to the bulk germanium region, and
   a second electrical contact to the layer of gallium arsenide.

10. The structure of claim 1, further including
    at least one additional solar cell junction overlying the layer of a phosphide material.

11. A multilayer semiconductor structure, comprising:
    a germanium substrate having a first surface, the germanium substrate comprising two regions,
       a bulk p-type germanium region, and
       a phosphorus-doped n-type germanium region adjacent to the first surface;
    a layer of a phosphide material overlying and contacting the first surface of the germanium substrate; and
    a layer of gallium arsenide overlying and contacting the layer of the phosphide material.

12. The structure of claim 11, wherein the layer of the phosphide material comprises a material selected from the group consisting of gallium indium phosphide, aluminum indium phosphide, and gallium aluminum indium phosphide.

13. The structure of claim 11, wherein the phosphorus-doped germanium region extends inwardly from the first surface toward the germanium region for a distance of about 0.1 to about 3.0 micrometers.

14. The structure of claim 11, wherein the phosphorus-doped region has an average phosphorus content of from about $1 \times 10^{17}$ to about $1 \times 10^{20}$ atoms per cubic centimeter.

15. The structure of claim 11, wherein the layer of the phosphide material has a thickness of from about 25 to about 5000 Angstroms.

16. The structure of claim 11, further including a first electrical contact to the bulk germanium region, and a second electrical contact to the layer of gallium arsenide.

17. A solar panel comprising at least two solar cells, each solar cell having a structure comprising a germanium substrate having a first surface, the germanium substrate comprising two regions,
  a bulk germanium region, and
  a phosphorus-doped germanium region adjacent to the first surface; and a layer of a phosphide material overlying and contacting the first surface of the germanium substrate.

18. The solar panel of claim 17, further including at least one additional solar cell junction overlying the layer of a phosphide material in each of the solar cells.

19. The solar panel of claim 17, wherein the layer of the phosphide material of each of the solar cells comprises a material selected from the group consisting of gallium indium phosphide, aluminum indium phosphide, and gallium aluminum indium phosphide.

20. The solar panel of claim 17, further including a support base to which the solar cells are mounted.

21. A method of making a multilayer semiconductor structure, comprising the steps of furnishing a germanium substrate having a first surface; thereafter diffusing phosphorus into the first surface of the substrate; and depositing a layer of a phosphide overlying and in contact with the first surface.

22. The method of claim 21, including a further step, after the step of depositing a layer of a phosphide, of depositing a layer of gallium arsenide overlying and in contact with the layer of a phosphide.

* * * * *